US012598821B2

(12) United States Patent
Hung et al.

(10) Patent No.: US 12,598,821 B2
(45) **Date of Patent: *Apr. 7, 2026**

(54) CHIP PACKAGE STRUCTURE AND METHOD FOR PRODUCING THE SAME

(71) Applicant: TONG HSING ELECTRONIC INDUSTRIES, LTD., Taipei City (TW)

(72) Inventors: Li-Chun Hung, Hsin-Chu County (TW); Jui-Hung Hsu, Hsin-Chu County (TW); Chien-Chen Lee, Hsin-Chu County (TW)

(73) Assignee: TONG HSING ELECTRONIC INDUSTRIES, LTD., Taipei City (TW)

( * ) Notice: Subject to any disclaimer, the term of this patent is extended or adjusted under 35 U.S.C. 154(b) by 411 days.

This patent is subject to a terminal disclaimer.

(21) Appl. No.: 18/184,976

(22) Filed: Mar. 16, 2023

(65) Prior Publication Data

US 2024/0136386 A1 Apr. 25, 2024
US 2024/0234475 A9 Jul. 11, 2024

(30) Foreign Application Priority Data

Oct. 21, 2022 (TW) .................................. 111139939

(51) Int. Cl.
*H10F 39/00* (2025.01)
*H10W 72/00* (2026.01)
*H10W 90/00* (2026.01)

(52) U.S. Cl.
CPC ......... *H10F 39/011* (2025.01); *H10F 39/804* (2025.01); *H10F 39/811* (2025.01); *H10W 72/07536* (2026.01); *H10W 90/754* (2026.01)

(58) Field of Classification Search
CPC ..................................................... H10F 39/011
See application file for complete search history.

(56) References Cited

U.S. PATENT DOCUMENTS

| | | | | |
|---|---|---|---|---|
| 2020/0350357 A1* | 11/2020 | Hung | ....................... | H01L 24/26 |
| 2024/0136202 A1* | 4/2024 | Hung | ....................... | H01L 24/92 |
| 2024/0371820 A1* | 11/2024 | Hsu | ......................... | H01L 23/10 |

* cited by examiner

*Primary Examiner* — Yu-Hsi D Sun

(74) *Attorney, Agent, or Firm* — Li & Cai Intellectual Property (USA) Office

(57) ABSTRACT

A chip package structure and a method for producing the same are provided. The method at least includes: providing a substrate; forming a mirror ink on the substrate; placing a chip upside-down on the substrate; forming soldering wires coupled with the chip and the substrate; forming a support body on the substrate; providing a package cover adhered to a top surface of the support body; performing a solidifying process in which a solidifying light beam is emitted to the mirror ink and the mirror ink reflects the solidifying light beam to the support body to solidify the support body; performing a packaging process in which a package layer is formed to cover the chip, an outer periphery of the support body, and the package cover; and performing a cutting process in which the package layer and the substrate are cut to form the chip package structure.

13 Claims, 9 Drawing Sheets

CHIP PACKAGE STRUCTURE AND METHOD FOR PRODUCING THE SAME

CROSS-REFERENCE TO RELATED PATENT APPLICATION

This application claims the benefit of priority to Taiwan Patent Application No. 111139939, filed on Oct. 21, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a chip package structure and method for producing the same, and more particularly to a chip package structure having a support body made of photo-curable glue and method for producing the same, and the support body of the chip package structure is solidified by a solidifying light beam.

BACKGROUND OF THE DISCLOSURE

In a conventional method for producing a chip package structure, a special photo-curable glue (e.g., an ultraviolet glue) may be used, and the photo-curable glue needs to be solidified by an ultraviolet light beam. For example, a complementary metal-oxide-semiconductor (CMOS) sensor die has a glass cover at a top side thereof, and the glass cover is disposed on a substrate through the photo-curable glue. The photo-curable glue airtightly surrounds an outer periphery of a sensing chip as a supporting fence structure for the sending chip. However, in a practical producing method, in order to prevent a flare issue from occurring, a black light-absorbing layer is added on the glass cover to block light beams, but adding the black light-absorbing layer causes the photo-curable glue to be unable to be solidified by the ultraviolet light beam.

Therefore, how to improve on the producing method to increase a production efficiency of the chip package structure and overcome the above-mentioned inadequacy has become an issue to be addressed in this technical field.

SUMMARY OF THE DISCLOSURE

In response to the above-referenced technical inadequacy, the present disclosure provides a chip package structure and method for producing the same.

In one aspect, the present disclosure provides a method for producing a chip package structure. The method at least includes the following steps: providing a substrate; forming a mirror ink on the substrate; providing a chip and placing the chip upside-down on the substrate; forming a plurality of soldering wires coupled with a plurality of conduct portions of the chip and a plurality of pads of the substrate; forming a support body on an upper surface of the substrate; providing a package cover adhered to a top surface of the support body; performing a solidifying process in which a solidifying light beam is emitted to the mirror ink and the mirror ink is utilized to reflect the solidifying light beam to the support body to solidify the support body; performing a packaging process in which a package layer is formed to cover the chip, an outer periphery of the support body, and the package cover, and the package layer does not completely cover an exposed surface of the package cover; and performing a cutting process in which the package layer and the substrate are cut along the mirror ink to form a chip package structure.

In another aspect, the present disclosure provides a chip package structure. The chip package structure includes am electrically conductive substrate, a plurality of soldering wires, a support body, and a package cover. The electrically conductive substrate includes a substrate having an upper surface, and a chip placed upside-down on the upper surface of the substrate. The soldering wires are coupled with a plurality of conduct portions of the chip and a plurality of pads of the substrate. The support body is formed on the upper surface of the substrate and surrounds the chip. The package cover is adhered to a top surface of the support body. The support body undergoes a solidifying process in which a solidifying light beam is reflected to the support body to solidify the support body.

In certain embodiments, the substrate has a mirror ink on the upper surface thereof.

Therefore, in the chip package structure and method for producing the same provided by the present disclosure, by virtue of "a step being implemented by performing a solidifying process in which a solidifying light beam is emitted to the mirror ink and the mirror ink is utilized to reflect the solidifying light beam to the support body to solidify the support body," a method for producing a chip package structure can be improved.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
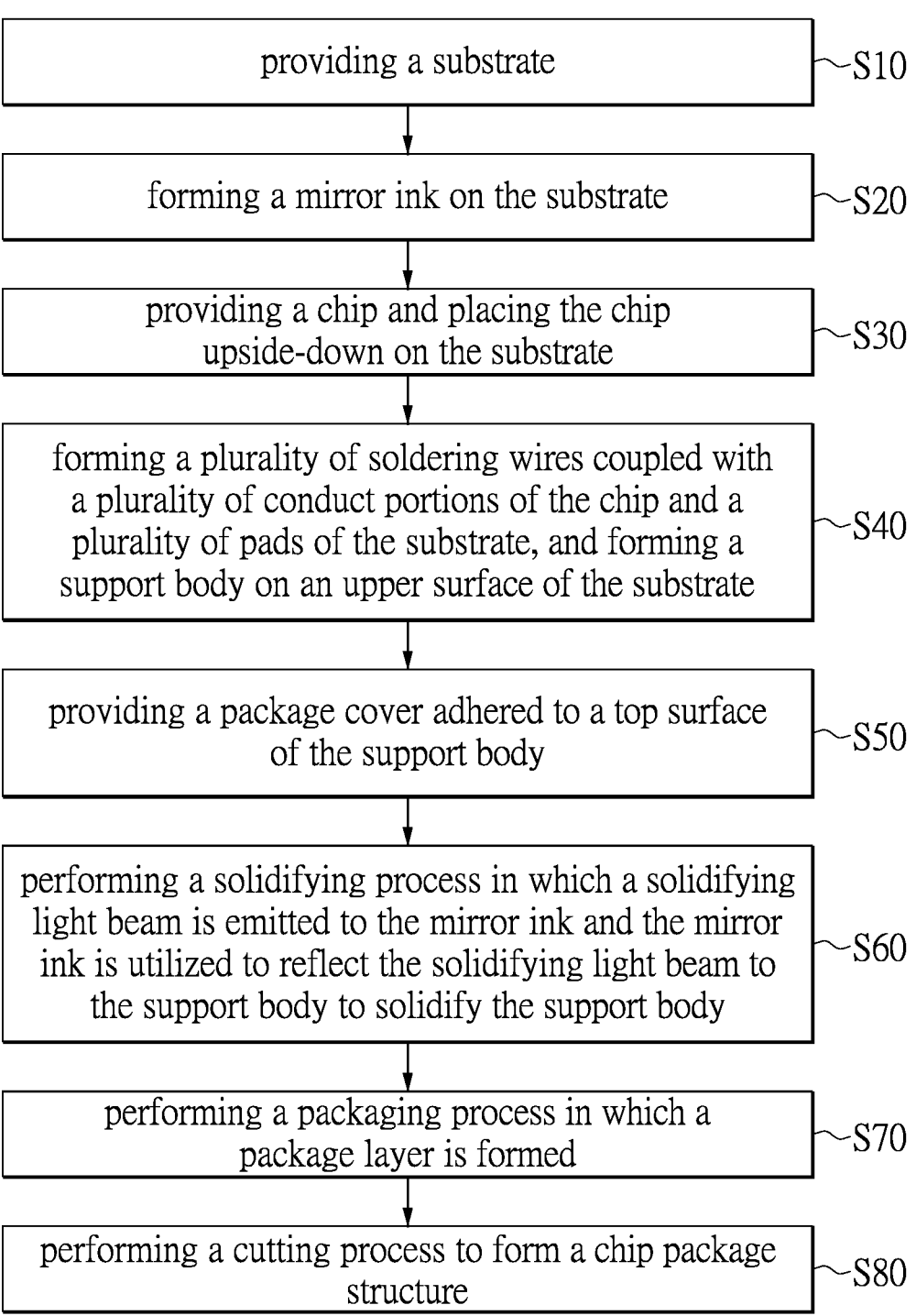
FIG. 1 is a flowchart of a method for producing a chip package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Figure 2:
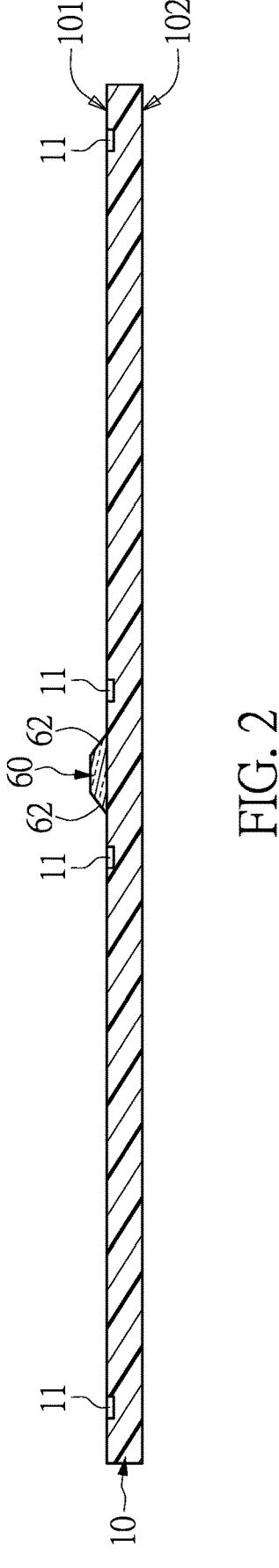
FIG. 2 is a schematic view of a mirror ink formed on the substrate according to the first embodiment of the present disclosure.

Referring to FIG. 1, a first embodiment of the present disclosure provides a method for producing a chip package structure, each step of the method is described in the following description with reference to the schematic figures. Firstly, as shown in FIG. 2, a step S10 is implemented by providing a substrate 10. A material of the substrate 10 can be ceramic, but the present disclosure is not limited thereto. The substrate 10 has an upper surface 101 and a lower surface 102. The substrate 10 has a plurality of pads 11 formed on the upper surface 101 thereof.

Referring to FIG. 2, a step S20 is implemented by forming a mirror ink 60 on the substrate 10. A material of the mirror ink 60 preferably is ultraviolet resistant and has a high reflective rate. Specifically, the mirror ink 60 includes a plurality of metal particles or metal sheet structures configured to reflect a light beam or an ultraviolet light beam. The mirror ink 60 can be formed on the substrate 10 by printing, coating, or spraying.

Figure 3:
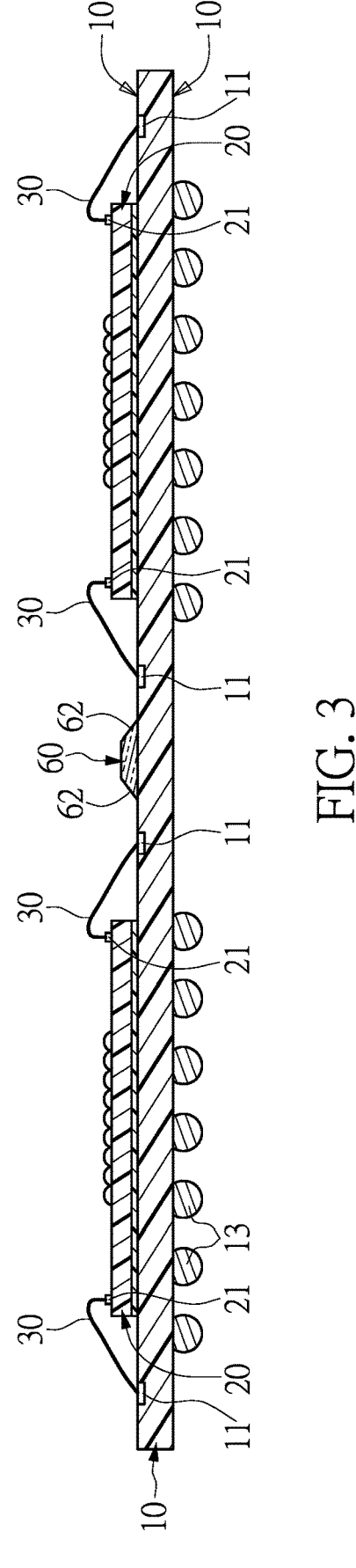
FIG. 3 is a schematic view of a chip placed upside-down according to the first embodiment of the present disclosure.

Referring to FIG. 3, a step S30 is implemented by providing a chip 20 and placing the chip 20 upside-down on the substrate 10. Specifically, the chip 20 is adhered to the upper surface 101 of the substrate 10. For example, the chip 20 can be an image sensor die having a photosensitive portion at a top surface thereof. For example, the chip 20 can be a complementary metal-oxide-semiconductor (CMOS) sensor die, but the present disclosure is not limited thereto.

The present disclosure is applicable to any chip package structure that requires an ultraviolet light beam to solidify a support body. The substrate 10 and the chip 20 can be regarded as an electrically conductive substrate.

It should be noted that, in the present embodiment, the lower surface 102 of the substrate 10 can have a plurality of solder balls 13.

A step S40 is implemented by forming a plurality of soldering wires 30 coupled with a plurality of conduct portions 21 of the chip 20 and a plurality of pads 11 of the substrate 10. Specifically, the soldering wires 30 connect the conducting portions 21 of the chip 20 and the pads 11 of the substrate 10.

Referring to FIG. 3, the step S40 is further implemented by forming a support body 40 on the upper surface 101 of the substrate 10. A material of the support body 40 can be a photo-curable glue (e.g., a ultraviolet glue). The support body 40 surrounds an outer periphery of the chip 20 to form an enclosed shape.

It should be noted that, a shape of the mirror ink 60 can correspond to a shape of the support body 40, and the step S20 of the present embodiment in which the mirror ink 60 is formed can be implemented by forming the mirror ink 60 having an enclosed shape to surround the outer periphery of the chip 20, but the present disclosure is not limited thereto. A shape of the mirror ink 60 can be linear or curved.

Figure 4:
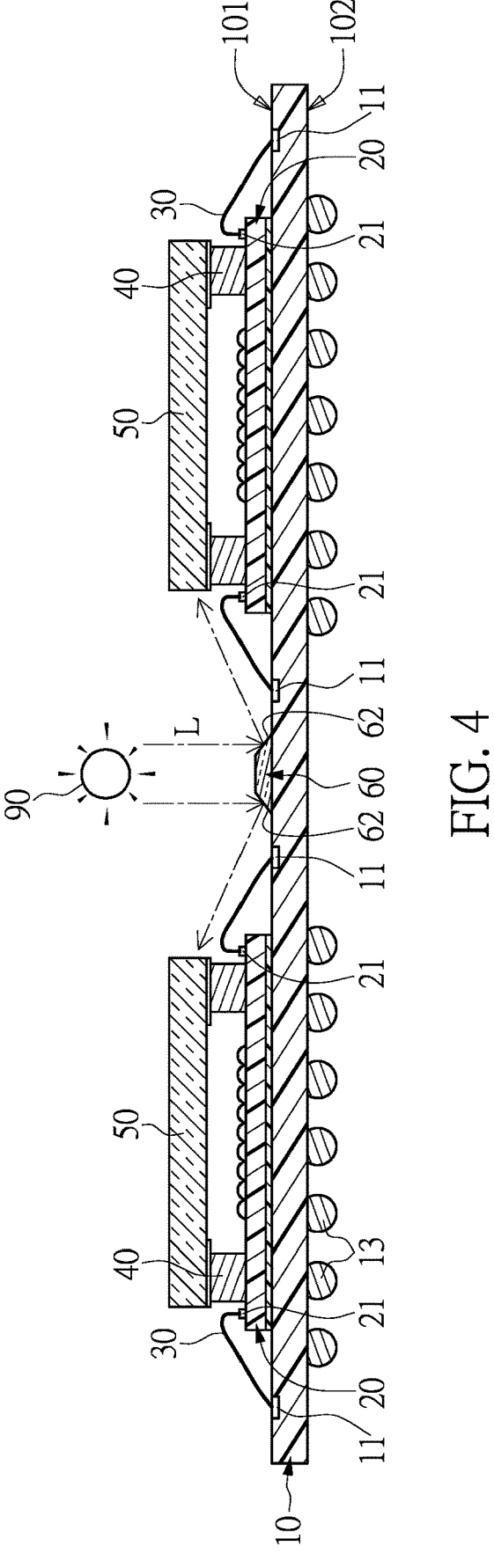
FIG. 4 is a schematic view of a solidifying process according to the first embodiment of the present disclosure.

Referring to FIG. 4, a step S50 is implemented by providing a package cover 50 adhered to a top surface of the support body 40. A material of the package cover 50 can be a transparent glass.

Referring to FIG. 4, a step S50 is implemented by performing a solidifying process in which a solidifying light beam L is emitted by a light source 90 to the mirror ink 60, and the mirror ink 60 is utilized to reflect the solidifying light beam L to the support body 40 so as to solidify the support body 40. It should be noted that, in the step 20 of the present embodiment in which the mirror ink 60 is formed, at least one mirror slope 62 is formed on the mirror ink 60. Specifically, a cross-sectional surface of the mirror ink 60 is substantially trapezoidal, and the mirror ink 60 includes two mirror slopes 62 respectively facing toward the support bodies 40 that are located at two sides of the mirror ink 60. Each of the mirror slopes 62 can reflect the solidifying light beam L to the support body 40, but the present disclosure is not limited thereto. The cross-sectional surface of the mirror ink 60 can be triangular or arced.

Figure 5:
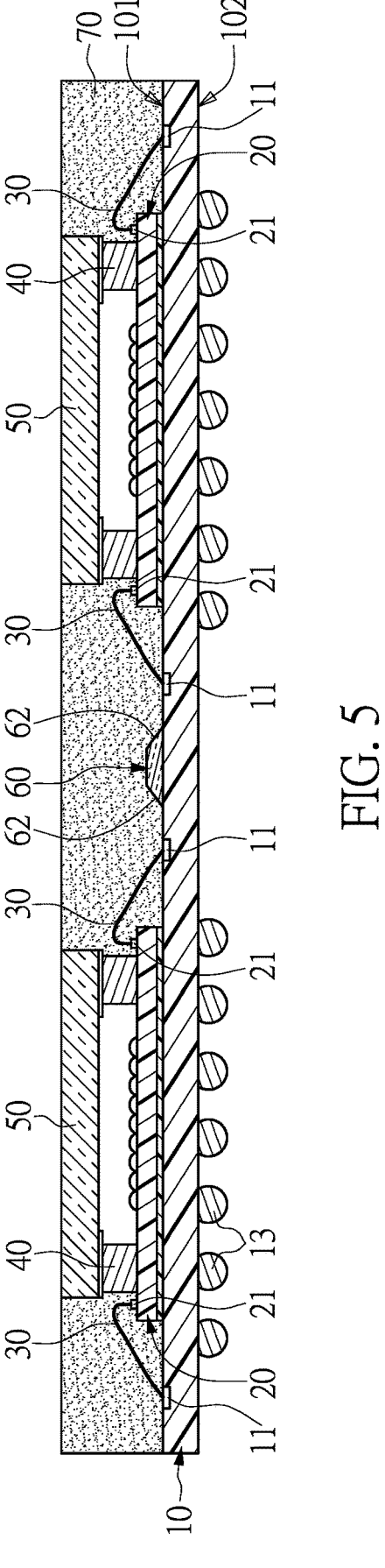
FIG. 5 is a schematic view showing a package layer being formed according to the first embodiment of the present disclosure.

Referring to FIG. 5, a step S70 is implemented by performing a packaging process in which a package layer 70 is formed to cover the chip 20, an outer periphery of the support body 40, and the package cover 50, and the package layer 70 does not completely cover an exposed surface of the package cover 50.

Figure 6:
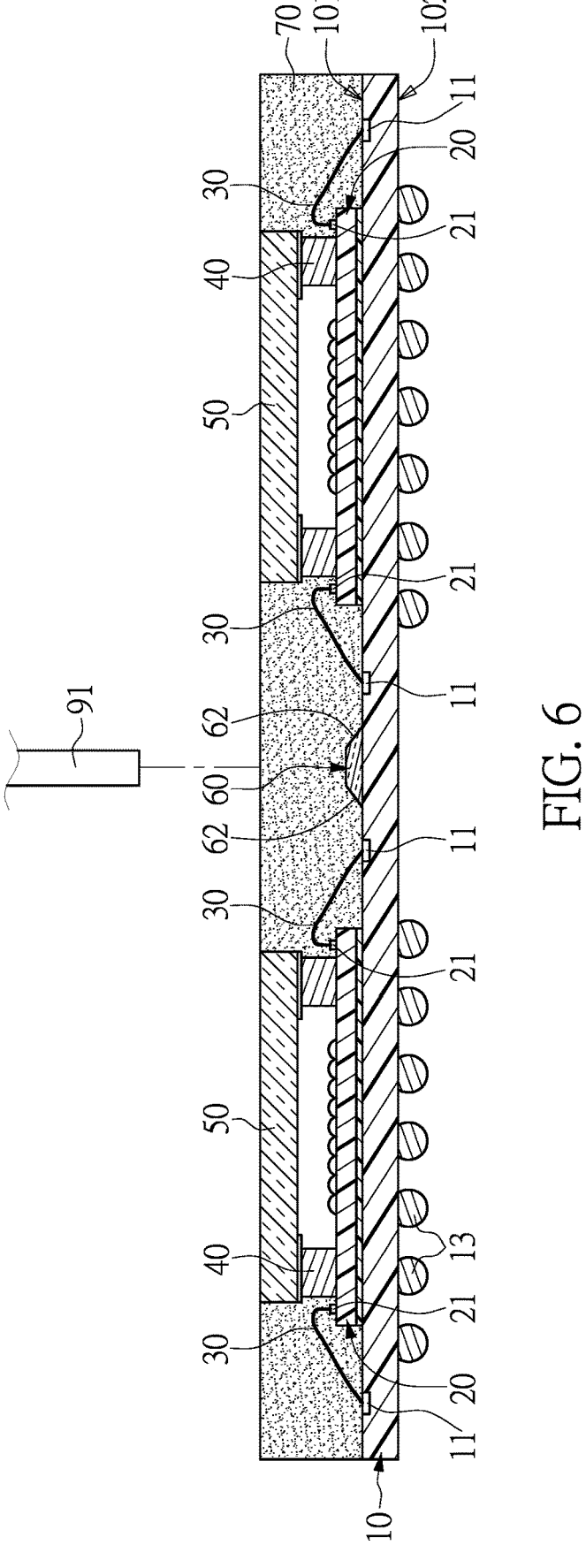
FIG. 6 is a schematic view of a cutting process according to the first embodiment of the present disclosure.
Figure 7:
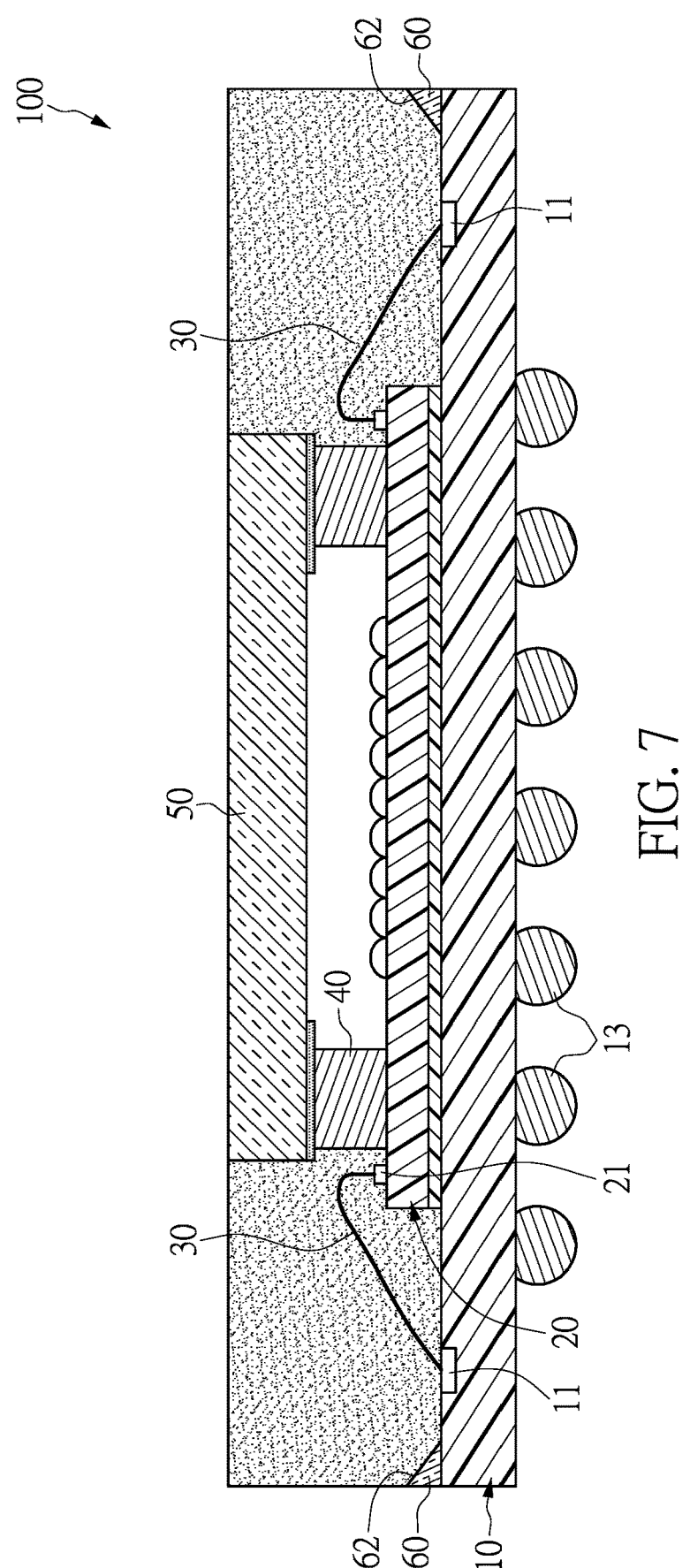
FIG. 7 is a schematic cross-sectional view of the chip package structure according to the first embodiment of the present disclosure.

Finally, as shown in FIG. 6, a step S80 is implemented by performing a cutting process in which a cutting knife 91 is used to cut the package layer 70 and the substrate 10 along the mirror ink 60 to form a chip package structure 100. Referring to FIG. 7, a width of the mirror ink 60 is greater than or equal to a thickness of the cutting knife 91 in the cutting process. After the substrate 10 is cut, parts of the mirror ink 60 remain at an edge of the upper surface 101 of the substrate 10.

It should be noted that, in the present embodiment, a quantity of the chips 20 is two, and the mirror ink 60 is disposed between the two chips 20. When an outer side of each of the two chips 20 is not blocked by other objects, the light source 90 can emit the solidifying light beam L directly to the support body 40 along a horizontal direction. In a practical producing process, a plurality of the chips 20 can be disposed on the substrate 10. Correspondingly, the mirror ink 60 can be arranged at an outer periphery of the chips 20 in a lattice shape or a mesh shape.

Second Embodiment

Figure 8:
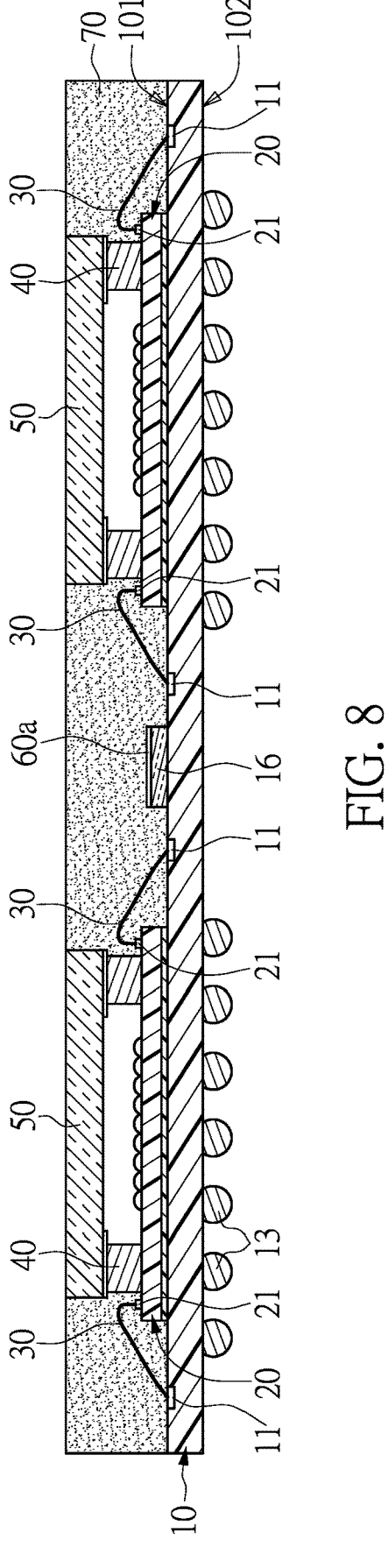
FIG. 8 is a schematic view of a method for producing a chip package structure according to a second embodiment of the present disclosure.

Referring to FIG. 8, the difference between the present embodiment and the first embodiment is as follows. The substrate 10 has a solder resist portion 16 on the upper surface 101 thereof, and a mirror ink 60a is formed on the solder resist portion 16. The solder resist portion 16 can be, for example, a solder resist layer, a solder resist ink, or a solder mask on a circuit board. Specifically, in the method for producing the chip package structure of the present embodiment, the solder resist portion 16 is formed on the substrate 10 by printing a solder resist material. A thickness of the solder resist portion 16 is from 0.8 mils to 1.8 mils. In other words, the solder resist portion 16 is 0.8 mils to 1.8 mils higher than the upper surface 101 of the substrate 10.

It should be noted that, in the solidifying process of the step S60 of the present embodiment, the solidifying light beam L is not necessarily perpendicular to the upper surface 101 of the substrate 10. For example, the solidifying light beam L can be inclined to the upper surface 101 of the substrate 10. A shape of a cross-sectional surface of the solder resist portion 16 is not limited to a shape as shown in FIG. 8, and can be triangular, trapezoidal, or arced. An advantageous effect of the present embodiment is that a usage amount of the mirror ink can be saved.

Third Embodiment

Figure 9:
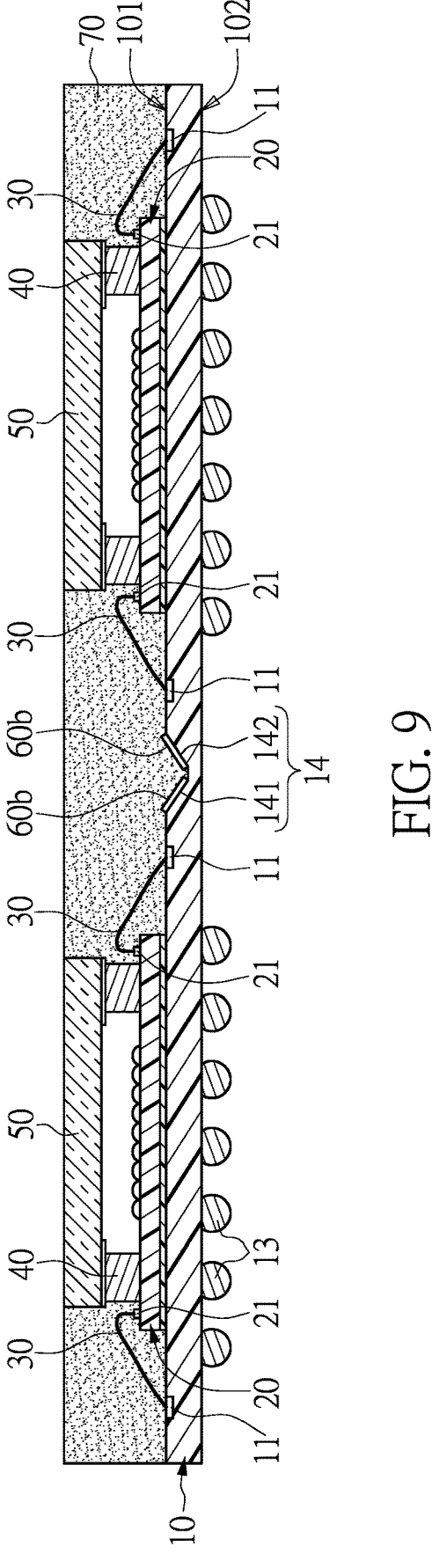
FIG. 9 is a schematic view of a method for producing a chip package structure according to a third embodiment of the present disclosure.

Referring to FIG. 9, the difference between the present embodiment and the first embodiment is as follows. A solder resist recess 14 is formed on the substrate 10, and a mirror ink 60b is formed on a surface of the solder resist recess 14. Specifically, the method for producing the chip package structure of the present embodiment further includes a step implemented by forming at least one concave slope 142 at the solder resist recess 14, the concave slope 142 is lower than the upper surface 101 of the substrate 10, and the mirror ink 60b is formed on the concave slope 142. In the present embodiment, the solder resist recess 14 has two concave slopes 141, 142 that respectively correspond to the support bodies 40 of the chip package structures at two sides of the solder resist recess 14. In the solidifying process of the present embodiment, the mirror ink 60b on the concave slope 141 at the left can reflect the solidifying light beam to the support body 40 at the right, and the mirror ink 60b on the concave slope 142 at the right can reflect the solidifying light beam to the support body 40 at the left. An advantageous effect of the present embodiment is that, the solder material and the usage amount of the mirror ink can be saved. The cross-sectional surface of the solder resist portion 14 is not limited in the present disclosure, and can be in other shapes (e.g., an arced shape).

It should be noted that, the present disclosure can mix the above-mentioned embodiments in the method for producing the chip package structure.

Beneficial Effects of the Embodiments

In conclusion, in the chip package structure and method for producing the same provided by the present disclosure, by virtue of "a step being implemented by performing a solidifying process in which a solidifying light beam is emitted to the mirror ink and the mirror ink is utilized to reflect the solidifying light beam to the support body to solidify the support body," a method for producing a chip package structure can be improved.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A method for producing a chip package structure, at least comprising:

providing a substrate;

forming a mirror ink on the substrate;

providing a chip and placing the chip upside-down on the substrate;

forming a plurality of soldering wires coupled with a plurality of conduct portions of the chip and a plurality of pads of the substrate;

forming a support body on an upper surface of the substrate;

providing a package cover adhered to a top surface of the support body;

performing a solidifying process in which a solidifying light beam is emitted to the mirror ink and the mirror ink is utilized to reflect the solidifying light beam to the support body to solidify the support body;

performing a packaging process in which a package layer is formed to cover the chip, an outer periphery of the support body, and the package cover, and the package layer does not completely cover an exposed surface of the package cover; and performing a cutting process in which the package layer and the substrate are cut along the mirror ink to form a chip package structure.

2. The method according to claim 1, wherein the mirror ink surrounds an outer periphery of the chip.

3. The method according to claim 1, wherein the mirror ink is formed on the substrate by printing or coating.

4. The method according to claim 1, wherein the mirror ink includes a plurality of metal particles or metal sheet structures configured to reflect the solidifying light beam.

5. The method according to claim 1, further comprising: forming at least one concave slope that faces toward the support body to reflect the solidifying light beam to the support body.

6. The method according to claim 1, wherein each of two sides of the mirror ink has a mirror slope, and each of the two sides of the mirror ink has the chip package structure formed thereon.

7. The method according to claim 1, wherein a width of the mirror ink is greater than or equal to a thickness of a cutting knife in the cutting process, and after the substrate is cut, parts of the mirror ink remain at an edge of the substrate.

8. The method according to claim 1, wherein the substrate has a solder resist portion thereon, and the mirror ink is formed on the solder resist portion.

9. The method according to claim 8, wherein the solder resist portion is formed on the substrate by printing a solder resist material.

10. The method according to claim 9, wherein a thickness of the solder resist portion is from 0.8 mils to 1.8 mils.

11. The method according to claim 1, wherein a solder resist recess is formed on the substrate, and the mirror ink is formed on a surface of the solder resist recess.

12. The method according to claim 11, further comprising: forming a concave slope at the solder resist recess; wherein the concave slope is lower than the upper surface of the substrate, and the mirror ink is formed on the concave slope.

13. A chip package structure produced by implementing the method according to claim 1.

\* \* \* \* \*